US010509064B2

(12) United States Patent
Fan

(10) Patent No.: US 10,509,064 B2
(45) Date of Patent: Dec. 17, 2019

(54) IMPEDANCE MEASUREMENT THROUGH WAVEFORM MONITORING

(71) Applicant: Tektronix, Inc., Beaverton, OR (US)

(72) Inventor: Zhiguang Fan, Shanghai (CN)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/706,579

(22) Filed: Sep. 15, 2017

(65) Prior Publication Data

US 2018/0106842 A1 Apr. 19, 2018

(30) Foreign Application Priority Data

Oct. 14, 2016 (CN) .......................... 2013 1 0900376

(51) Int. Cl.
*G01R 27/16* (2006.01)
*G01R 31/36* (2019.01)
*G01R 31/12* (2006.01)
*G01R 27/04* (2006.01)
*G01R 35/00* (2006.01)
G01R 27/32 (2006.01)

(52) U.S. Cl.
CPC .............. *G01R 27/16* (2013.01); *G01R 27/04* (2013.01); *G01R 31/1227* (2013.01); *G01R 31/3648* (2013.01); *G01R 35/005* (2013.01); G01R 27/32 (2013.01)

(58) Field of Classification Search
CPC ...................................................... G01R 27/04
See application file for complete search history.

(56) References Cited

U.S. PATENT DOCUMENTS

| 5,345,182 A * | 9/1994 | Wakamatsu ........... G01R 27/06 324/522 |
| 2014/0009990 A1 | 1/2014 | Kapoor |
| 2015/0212185 A1 | 7/2015 | Pickerd et al. |
| 2016/0226558 A1 | 8/2016 | Fan |

OTHER PUBLICATIONS

EESR—European Patent Office, Extended European Search Report and Written Opinion for European Application 17196463.8, Feb. 14, 2018, 7 pages, Munich, Germany.

* cited by examiner

*Primary Examiner* — Clayton E. LaBalle
*Assistant Examiner* — Jas A Sanghera
(74) *Attorney, Agent, or Firm* — Miller Nash Graham & Dunn; Andrew J. Harrington

(57) ABSTRACT

Embodiments of the invention provide a capability of determining an input impedance of a connected Device Under Test based on Waveform Monitoring of an output signal of a waveform generator. Using embodiments of the invention, the input impedance of DUT is determined from the waveform monitoring results. The impedance information of the DUT together with the actual waveform provided to the DUT allows systems according to embodiments of the invention capable of characterizing circuit behavior for performance optimizing and issue debugging for the DUT.

14 Claims, 3 Drawing Sheets

IMPEDANCE MEASUREMENT THROUGH WAVEFORM MONITORING

FIELD OF THE INVENTION

This disclosure is directed to a system and methods for electrical impedance measurement, and, more particularly, to a system and methods for electrical impedance measurement using waveform monitoring techniques.

BACKGROUND

An Arbitrary Waveform and Function Generator (AFG) instrument is widely utilized for generating continuous/burst user-defined/mathematical function waveform signals for electronic circuit design and testing. AFGs typically have an output impedance of 50 Ohm over their operating frequency range. It is known that the input impedance of DUT (Device Under Test) will impact the output signal created by the AFG. Measuring the DUT's impedance across a wide frequency range typically requires a Vector Network Analyzer (VNA). However, a VNA does not provide the waveform signal information applied on the DUT, which is often needed for full analysis in the time domain. Therefore, measuring the DUT's impedance while monitoring the waveform of the AFG remains unavailable to perform.

Embodiments of the invention address these and other issues in the prior art.

DETAILED DESCRIPTION

Embodiments of the invention include techniques for performing real-time waveform monitoring of the active signal on a Device Under Test (DUT) with a cable de-embedding function. Embodiments also allow the users to determine the input impedance of DUT to characterize the circuit behavior for performance optimizing and issue debugging. As described below, using embodiments of the invention, it is possible to perform both waveform monitoring and impedance measurement through one single AFG instrument.

Figure 1:
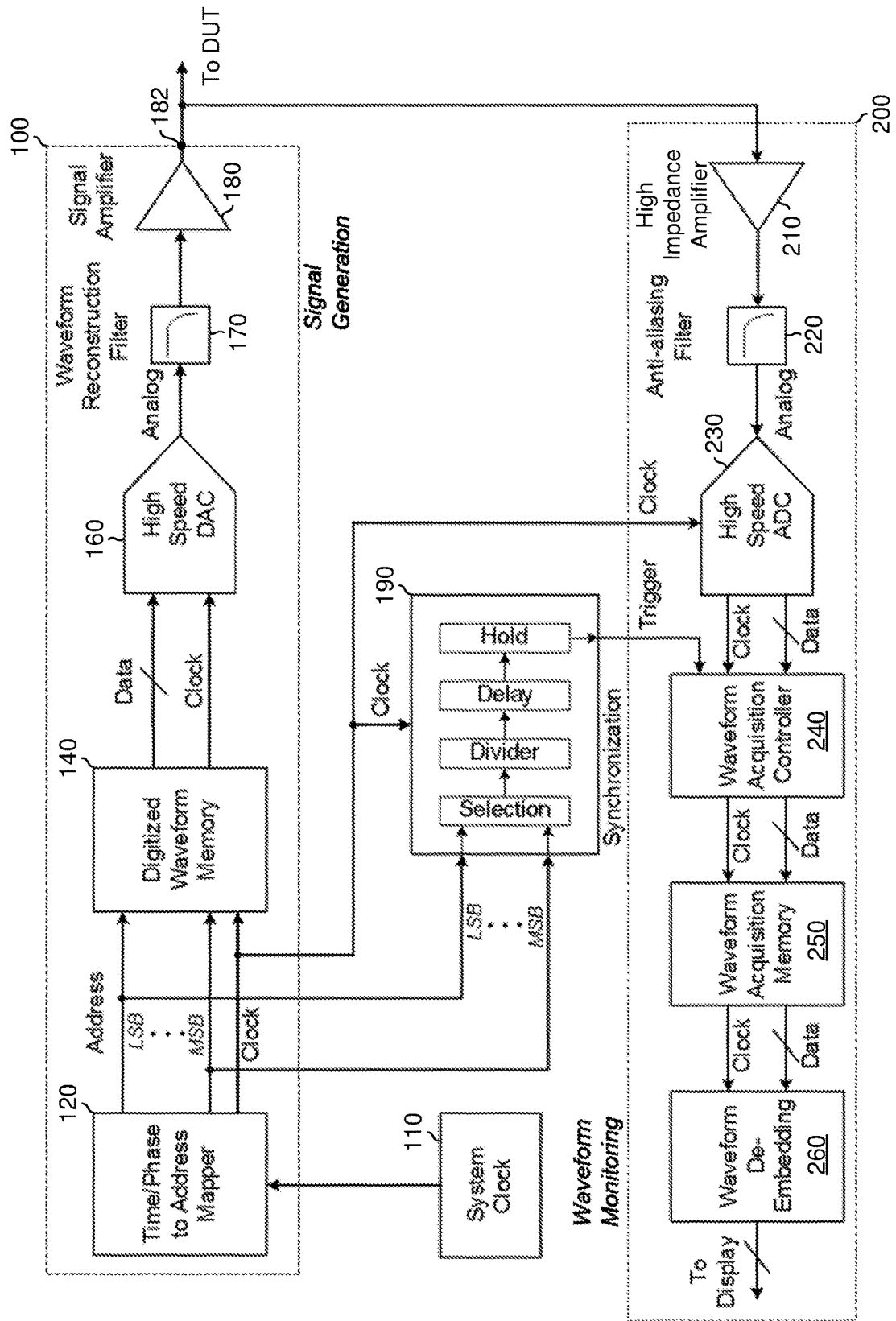
FIG. 1 is a schematic block diagram illustrating an Arbitrary Waveform and Function Generator having waveform monitoring according to embodiments of the invention.

FIG. 1 is a block diagram of a test system including an AFG according to embodiments of the invention. An Arbitrary Waveform and Function Generator (AFG) 100 produces custom and standard waveform signals that are useful while designing and testing circuits and devices. Although description of embodiments of the invention is given with reference to an AFG, any type of device that generates waveforms could be used. The AFG 100, in general, produces an output signal 182 at the output of a signal amplifier 180. The particular desired output signal is selected by a user. Once selected, a Time/Phase to address mapper 120 produces addresses to store an intermediate form of the desired signal in a waveform memory 140. The address mapper 120 includes input from a system clock 110, and generates both address data and clock data to be input to the waveform memory 140. A converter, such as a high-speed Digital to Analog Converter (DAC) 160 converts the digital signal from the waveform memory 140 to an analog signal. A filter, such as the waveform reconstruction filter 170 filters the analog signal before it is passed to the signal amplifier 180 for output as the output signal 182.

The output signal 182 from the AFG 100 may be passed to a Device Under Test (DUT). Advantageously, by analyzing the output signal 182 with a waveform analyzer, such as a waveform analyzer 200 illustrated in FIG. 1, an input impedance of the DUT that is coupled to the output signal 182 may be determined.

The waveform analyzer 200 illustrated in FIG. 1 includes an amplifier 210 that receives an input signal. In this case, the input signal to the waveform analyzer 200 is the output signal 182 of the AFG 100. The output signal 182 of the AFG 100 is also coupled to the DUT. The input signal to the waveform analyzer 200 is passed through an anti-aliasing filter 220 before being provided to an ADC 230, which converts the analog signal to digital signals, including a clock and data signals. Those data and clock signals are fed to a waveform acquisition controller 240. Also provided to the waveform acquisition controller 240 is a trigger signal derived from a synchronizer 190 that is coupled between the AFG 100 and waveform analyzer 200. The waveform acquisition controller 240 is coupled to waveform acquisition memory 250. The waveforms may be de-embedded and supplied to a de-embedder 260 before being sent to a display (not separately illustrated). The display illustrates the de-embedded waveform visually for the user.

Embodiments of the invention are able to measure an input impedance of the DUT coupled to the output 182 of the AFG 100 by analyzing waveform presented to the DUT.

Figure 2:
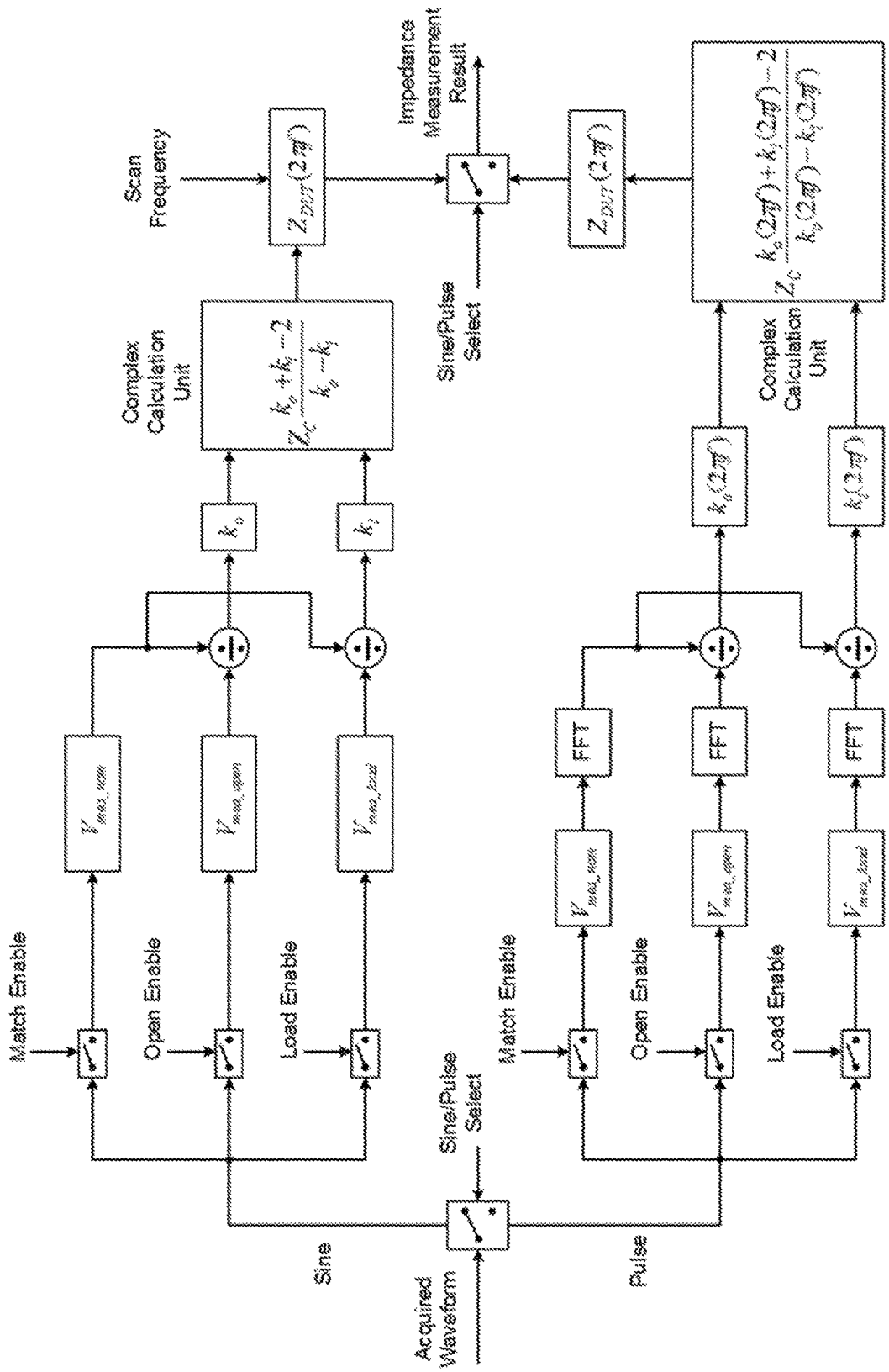
FIG. 2 is a block diagram illustrating various example measurements used in embodiments of the invention to perform impedance determination.
Figure 3:
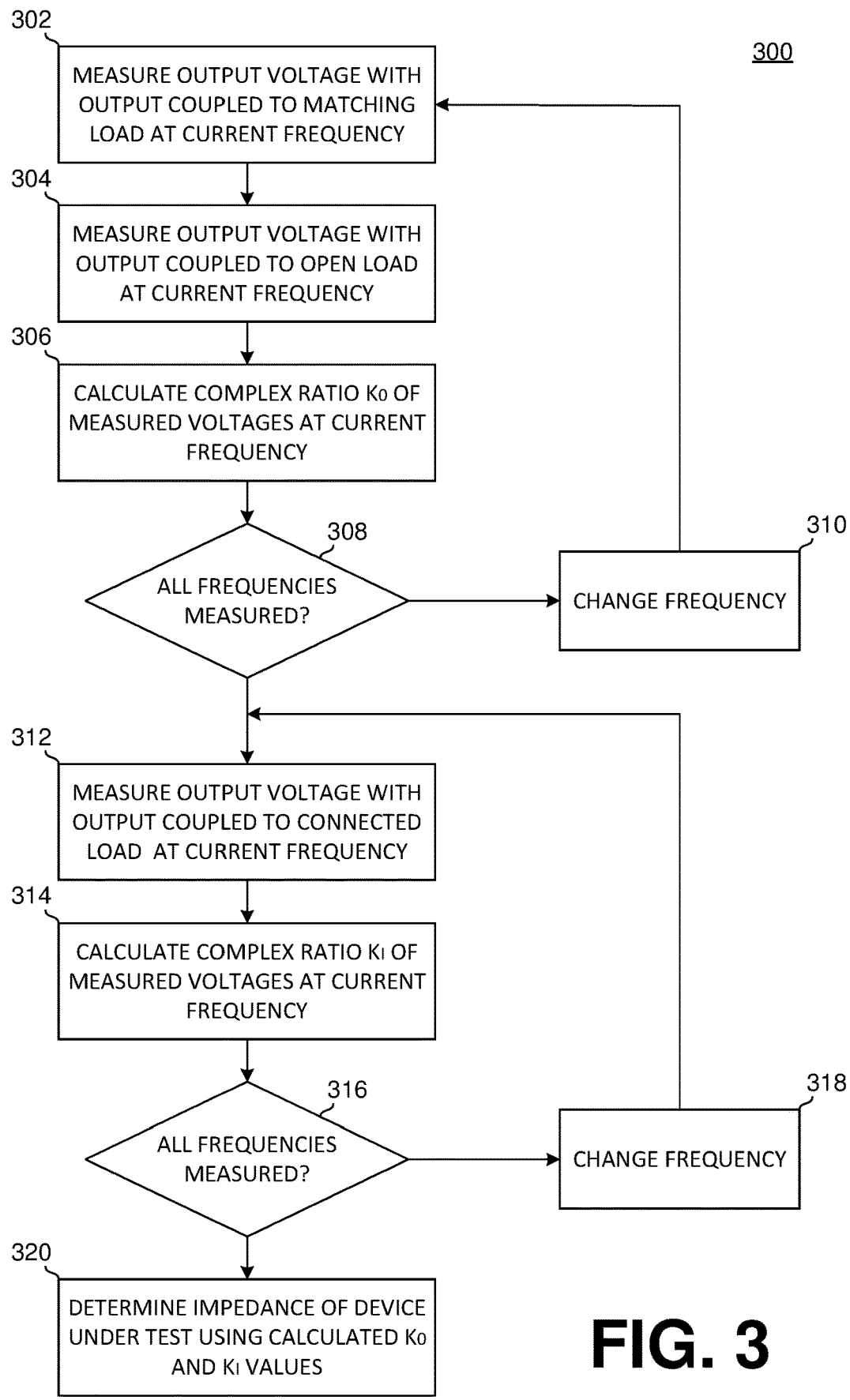
FIG. 3 is a flow diagram illustrating example operations used in embodiments of the invention.

FIG. 2 is a block diagram illustrating various example measurements used in embodiments of the invention to perform impedance determination. FIG. 3 is an example flow diagram 300 illustrating example steps that may be used in determining the input impedance of a DUT based on waveform monitoring. Embodiments of the invention are now described with reference to FIGS. 2 and 3. A first process 302 in measuring the input impedance of the DUT is to measure a voltage of the signal at the output 180 of the AFG 100. This is sometimes called the Bayonet Neill-Concelman (BNC) output because the AFG 100 typically connects to a DUT through a BNC connector.

More specifically, in one embodiment, the first process 302 measures the voltage at the output 180 when the AFG 100 is producing a sine signal of frequency f with a cable coupled to the BNC output coupled to a matching load, i.e., a load that is equal to the cable characteristic impedance, $Z_C$, and produces the complex measurement result of nominal output $V_{mea\_nom}$ of the AFG 100 through synchronous acquisition. In other words, $V_{mea\_nom}$ can be expressed in a complex format as:

$$V_{mea\_nom} = Abs(V_{mea\_nom}) e^{jAngle(V_{mea\_nom})} \qquad \text{Equation 1}$$

where a synchronous trigger signal is used as reference phase.

Next, a process 304 measures the voltage at output 180 for the sine signal of the frequency of f with the coaxial cable terminated with an open load through synchronous acquisition. That is, the signal is fully reflected by the load, and a complex ratio $k_o$ of the measured result ($V_{mea\_open}$) to nominal output ($V_{mea\_nom}$) may be calculated in an operation 306 as:

$$k_o = \frac{V_{mea\_open}}{V_{mea\_nom}} = 1 + e^{-2l(\alpha+j\beta)} \quad \text{Equation 2}$$

where α is the unknown attenuation coefficient, β is the unknown waveform number, and l is the unknown length of the coaxial cable.

The operations 302, 304, and 306 are repeated with different frequencies to scan the entire frequency range and characterize $k_o$ of the coaxial cable at a specified frequency step of Δf, which is normally frequency-dependent. FIG. 3 illustrates this as determining whether the entire frequency range has been scanned in an operation 308. If the entire frequency spectrum of the AFG 100 has not been scanned, the frequency is changed in an operation 310, and the operations 302, 304, and 306 are repeated using the new frequency. As mentioned above, the frequency is changed in the operation 310 by the frequency step of Δf.

Next, the AFG 100 is connected to a DUT, and an operation 312 measures the voltage at the output 180 of the AFG 100 for the sine signal of the frequency of f with the coaxial cable terminated at the DUT. Then, an operation 314 calculates the complex ratio $k_l$ of measurement result ($V_{mea\_load}$) to nominal output ($V_{mea\_nom}$) of the AFG 100 through synchronous acquisition according to the following equation:

$$k_l = \frac{V_{mea\_load}}{V_{mea\_nom}} = 1 + e^{-2l(\alpha+j\beta)} \frac{Z_{DUT} - Z_C}{Z_{DUT} + Z_C} \quad \text{Equation 3}$$

where $Z_{DUT}$ is the unknown input impedance of DUT.

The operations 312 and 314 are repeated at different frequencies to scan the entire frequency range and characterize $k_l$ of the coaxial cable at a specified frequency step of Δf, which is normally frequency-dependent. FIG. 3 illustrates this as determining whether the entire frequency range has been scanned in an operation 316. If the entire frequency spectrum of the AFG 100 has not been scanned, the frequency is changed in an operation 318, and the operations 312 and 314 are repeated using the new frequency. As mentioned above, the frequency is changed in the operation 318 by the frequency step of Δf.

After $k_o$ and $k_l$ have been characterized using operations 302-318, an operation 320 uses, for the sine signal of f frequency, the characterized $k_o$ and $k_l$ values to determine the complex input impedance of the DUT by using Equation 4.

$$Z_{DUT} = Z_C \frac{k_o + k_l - 2}{k_o - k_l} \quad \text{Equation 4}$$

By performing operation 320 for all of the sampled frequencies, the entire frequency range of the AFG 100 may be used to fully characterize the input impedance of the DUT, $Z_{DUT}(2\pi f)$, at specified frequency step of Δf, which is normally frequency-dependent.

In other embodiments, instead of a sine wave, it is feasible to use a pulse signal or other arbitrary waveform signal to accelerate the above measurement process of frequency scanning. The procedure is almost the same except for calculating the Fourier Transform of $V_{mea\_nom}$, $V_{mea\_open}$, $V_{mea\_load}$, $k_o$, $k_l$ in frequency domain, which gives the frequency-dependent complex $Z_{DUT}$ as illustrated in FIG. 2 and Equation 5:

$$Z_{DUT}(2\pi f) = Z_C \frac{k_o(2\pi f) + k_l(2\pi f) - 2}{k_o(2\pi f) - k_l(2\pi f)} \quad \text{Equation 5}$$

Substituting a pulse waveform for the sine wave described above in characterizing the input impedance of the DUT saves measurement time, since the pulses may be analyzed quicker than the sine wave. The pulse method is less accurate than the sine wave method, however, since the pulse wave method is more sensitive to noises.

An example validation process showing impedance measurement may be emulated using the instructions set out below, using a signal generator AFG3252C and oscilloscope MSO4104B, both available from TEKTRONIX, INC. of Beaverton, Oreg., USA:

1) Set the output of sine wave of 10 MHz, 1 Vpp, 50 Ohm for the AFG, and use its Trigger Out for the MSO acquisition;

2) Connect the cable from the AFG to the MSO and set the MSO termination to 50 Ohms, and measure the voltage at the BNC output of the AFG with a probe;

3) Disconnect the cable to the input of the MSO to leave the cable as Open and measure the voltages at the BNC output of the AFG with the probe;

4) Connect the cable to the DUT (for example, using paralleled multiple BNC-BNC type 50 Ohm loads including MSO input impedance) and connect the DUT to one MSO channel and set the channel to 50 Ohm termination, then use the probe with another channel to measure the voltage at the BNC output of the AFG;

5) Calculate out the input impedance of the DUT using the steps described above with reference to FIGS. 2 and 3, which shows an absolute error of <11% as shown in Table 1, below.

TABLE 1

| $V_{mea\_nom}(V/\theta)$ | $V_{mea\_open}(V/\theta)$ | $V_{mea\_load}(V/\theta)$ $\left(\text{DUT} = \frac{50}{2}\Omega\right)$ | $V_{mea\_load}(V/\theta)$ $\left(\text{DUT} = \frac{50}{3}\Omega\right)$ | $V_{mea\_load}(V/\theta)$ $\left(\text{DUT} = \frac{50}{4}\Omega\right)$ |
|---|---|---|---|---|
| 1.034/2.8° | 1.887/−20.8° | 0.848/17.1° | 0.771/28.3° | 0.758/37.6° |
| | | $Z_{DUT}(\Omega)$ Measurement 27.5 − j 0.8 | $Z_{DUT}(\Omega)$ Measurement 18.4 − j 1.1 | $Z_{DUT}(\Omega)$ Measurement 13.2 − j 0.4 |

Sources of the error of the above emulation may include a) Trigger error, since the oscilloscope is running asynchronously with the AFG; b) Measurement error, such as phase error, amplitude error, probe disturbance, etc.; and c) System error: assume ideal impedance values for load, AFG and cable.

Embodiments of the invention will mostly eliminate sources of error listed in "a" and "b" in the preceding paragraph. Also, the error "c" can be addressed further through minimizing the variations of the output impedance of the AFG 100, load impedance, and cable impedance. In other words, embodiments of the invention will improve the measurement accuracy to a much higher level than is presently available.

Using the above-described techniques, the input impedance of DUT may be determined from the waveform monitoring results. The information of impedance of DUT together with the actual waveform on DUT makes AFG capable of characterizing the circuit behavior for performance optimizing and issue debugging for DUT.

Embodiments of the invention may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Although specific embodiments of the invention have been illustrated and described for purposes of illustration, it will be understood that various modifications may be made without departing from the spirit and scope of the invention. Accordingly, the invention should not be limited except as by the appended claims.

I claim:

1. A method of determining electrical input impedance of a Device Under Test (DUT) in a network including a waveform generator structured to provide waveform information of a test waveform at an output of the waveform generator, and a waveform monitor having an input coupled to the output of the waveform generator, the method comprising:
coupling the output of the waveform generator to a load matching a cable load;
measuring a first voltage of the test waveform at one or more frequencies;
coupling the output of the waveform generator to an open load;
measuring a second voltage of the test waveform at the same one or more frequencies;
coupling the output of the waveform generator to the DUT through a cable having the same load as the cable load;
measuring a third voltage of the test waveform at the same one or more frequencies; and
determining the input impedance of the DUT from the measured voltages.

2. The method of determining electrical input impedance according to claim 1, further comprising determining a complex ratio $k_o$ using the measured first voltage and the measured second voltage.

3. The method of determining electrical input impedance according to claim 2, further comprising determining a complex ratio $k_l$ using the measured first voltage and the measured third voltage.

4. The method of determining electrical input impedance according to claim 3, further comprising determining the input impedance of the DUT from the $k_o$ and $k_l$ values.

5. The method of determining electrical input impedance according to claim 3, in which determining the input impedance of the DUT comprises, for at least one frequency f of the one or more frequencies, solving the equation:

$$Z_{DUT}(2\pi f) = Z_C \frac{k_o(2\pi f) + k_l(2\pi f) - 2}{k_o(2\pi f) - k_l(2\pi f)},$$

wherein $Z_C$ is a characteristic impedance of the cable and $Z_{DUT}$ is the input impedance of the DUT.

6. The method of determining electrical input impedance according to claim 1, in which the test waveform is a sine wave.

7. The method of determining electrical input impedance according to claim 1, in which the test waveform is a pulse.

8. A waveform monitor for determining electrical input impedance of a Device Under Test (DUT), the waveform monitor coupled to an output of a waveform generator and having an input for receiving information of a test waveform produced by the waveform generator, the waveform monitor comprising:
a first measuring apparatus for measuring a first voltage of the test waveform at one or more frequencies when the output of the waveform generator is coupled to a load matching a cable load;

a second measuring apparatus for measuring a second voltage of the test waveform at the one or more frequencies when the output of the waveform generator is coupled to an open load;

a third measuring apparatus for measuring a third voltage of the test waveform at the one or more frequencies when the output of the waveform generator is coupled to the DUT through a cable having a load that matches the cable load; and a processor structured to determine the electrical input impedance of the DUT from the measured voltages of the first measuring apparatus, the second measuring apparatus, and the third measuring apparatus.

9. The waveform monitor according to claim 8, in which the processor is structured to determine a complex ratio $k_o$ using the measured voltages of the first measuring apparatus and the second measuring apparatus.

10. The waveform monitor according to claim 9, in which the processor is structured to determine a complex ratio $k_l$ using the measured voltages of the first measuring apparatus and the third measuring apparatus.

11. The waveform monitor according to claim 10, in which the processor is structured to determine the electrical input impedance of the DUT from the $k_o$ and $k_l$ values.

12. The waveform monitor according to claim 10, in which the processor is structured to determine the input impedance of the DUT, for at least one frequency f of the one or more frequencies, by solving the equation:

$$Z_{DUT}(2\pi f) = Z_C \frac{k_o(2\pi f) + k_l(2\pi f) - 2}{k_o(2\pi f) - k_l(2\pi f)},$$

wherein $Z_C$ is a characteristic impedance of the cable and $Z_{DUT}$ is the input impedance of the DUT.

13. The waveform monitor according to claim 8, in which the test waveform is a sine wave.

14. The waveform monitor according to claim 8, in which the test waveform is a pulse.

* * * * *